United States Patent [19]
Holterman et al.

[11] Patent Number: 5,155,664
[45] Date of Patent: Oct. 13, 1992

[54] OPERATOR INTERFACE PANEL ASSEMBLY FOR USE WITH A PROGRAMMABLE LOGIC CONTROLLER

[75] Inventors: Randall R. Holterman, Mequon; John Maggelet, Sussex, both of Wis.

[73] Assignee: Square D Company, Palatine, Ill.

[21] Appl. No.: 635,032

[22] Filed: Dec. 28, 1990

[51] Int. Cl.$^5$ .............................................. H05K 5/00
[52] U.S. Cl. ........................ 361/399; 361/394; 361/393; 361/400; 361/413; 248/27; 364/708
[58] Field of Search .............. 361/380, 392, 393, 394, 361/399, 397, 400, 412, 413, 414; 248/27.1, 27.3, 27; 200/296; 364/708

[56] References Cited
U.S. PATENT DOCUMENTS 3,895,268  7/1975  May et al. ............................ 317/120
4,658,375  4/1987  Onogi et al. ......................... 364/900
4,908,738  3/1990  Kobari et al. ........................ 361/429

Primary Examiner—Leo P. Picard
Assistant Examiner—Young S. Whang
Attorney, Agent, or Firm—Michael J. Femal; Richard J. Graefe

[57] ABSTRACT

An operator interface panel assembly is used with a programmable logic controller. Through the use of a printed wired circuit board, a wide variety of input and output components that must be accessible to an operator can be assembled by the user at the location of the installation rather than at the point of manufacture. The assembly can be easily reconfigured without costly rewiring of the installation. The same switch or pilot light position can accommodate a variety of one and two pole switches without hardware modification.

10 Claims, 5 Drawing Sheets

|   | 13-14 | 23-24 | X1-X2 |
|---|---|---|---|
| A | o/o |  | ※ |
| B |  | o\o | ※ |
| C | o/o | o\o | ※ |
| D | o/o | o/o | ※ |
| E | o\o | o\o | ※ |
| F |  |  | ※ |

OPERATOR INTERFACE PANEL ASSEMBLY FOR USE WITH A PROGRAMMABLE LOGIC CONTROLLER

DESCRIPTION

1. Technical Field

Applicants' invention relates generally to electrical control mechanisms and more particularly to a panel assembly for inputting and outputting information to a programmable logic controller that performs a number of control functions.

2. Background Art

Panel assemblies supporting a plurality of interconnected electric switches and indicator lamps to provide a variety of control functions are well known. In many instances, these assemblies supply the inputs to a programmable logic controller (PLC) that is normally used to control a number of functions in a manufacturing operation. This programmable logic controller is often of necessity located on the plant floor and thus is subject to considerable abuse. Wiring between the PLC and the panel assembly is subject to high installation costs and often a means for electrical noise to enter the system.

The panel assemblies are usually custom made by a manufacturer for a particular application. This results in high manufacturing costs because of the custom wiring required to interconnect the various components on the panel assembly. These assemblies generally contain various input/output devices that must be outwardly exposed to permit operator monitoring and/or actuation. The input devices can be push button, toggle, or selector switches. The output devices are indicators or pilot lights that provide a visual indication of the operation of the controlled manufacturing process.

It is also well known that the switches and indicators require frequent replacement when a malfunction occurs. Since a malfunction of necessity shuts down the machine operation, replacement must be made in a minimum amount of time. Further, the needs of the application may change, resulting in a change in the configuration of the panel assembly.

The present invention provides a simplified operator interface panel assembly which easily accommodates various combinations of switches and indicators and that is reconfigurable in the field to accommodate changes in the manufacturing operation that is to be controlled by the PLC.

SUMMARY OF THE INVENTION

According to the present invention, the operator interface panel assembly has a fixed, prewired circuit board containing sockets and a serial interface module. The circuit board is attached to a front panel by four standoffs. The front panel has a plurality of windows or openings for exposing and securing a plurality of input/output devices that are plugged into the sockets that are present on the circuit board. Each device consists of contact block and an operator that fits to the contact block. The contact block can have a single or two pole normally-open contact or normally-closed contact, or a two pole normally-open, normally-closed contact. The contact block can also have provisions for a pilot light. The operator can be a push button, a toggle or a two or three position selector switch. Any odd numbered position can accept any type of switch but if a two pole device is used, the adjacent even numbered position can only be used for a pilot light. This flexibility allows the users to configure the assembly to fit their requirements without having to custom order a completed assembly from a manufacturer. The serial interface module provides the link between the assembly and the PLC. Programming within the PLC identifies the function and the location of each position.

According to one aspect of the invention, the front panel has two rows of four such openings for a total of eight locations. This provides for a maximum of eight inputs and eight outputs.

DETAILED DESCRIPTION

Figure 1:
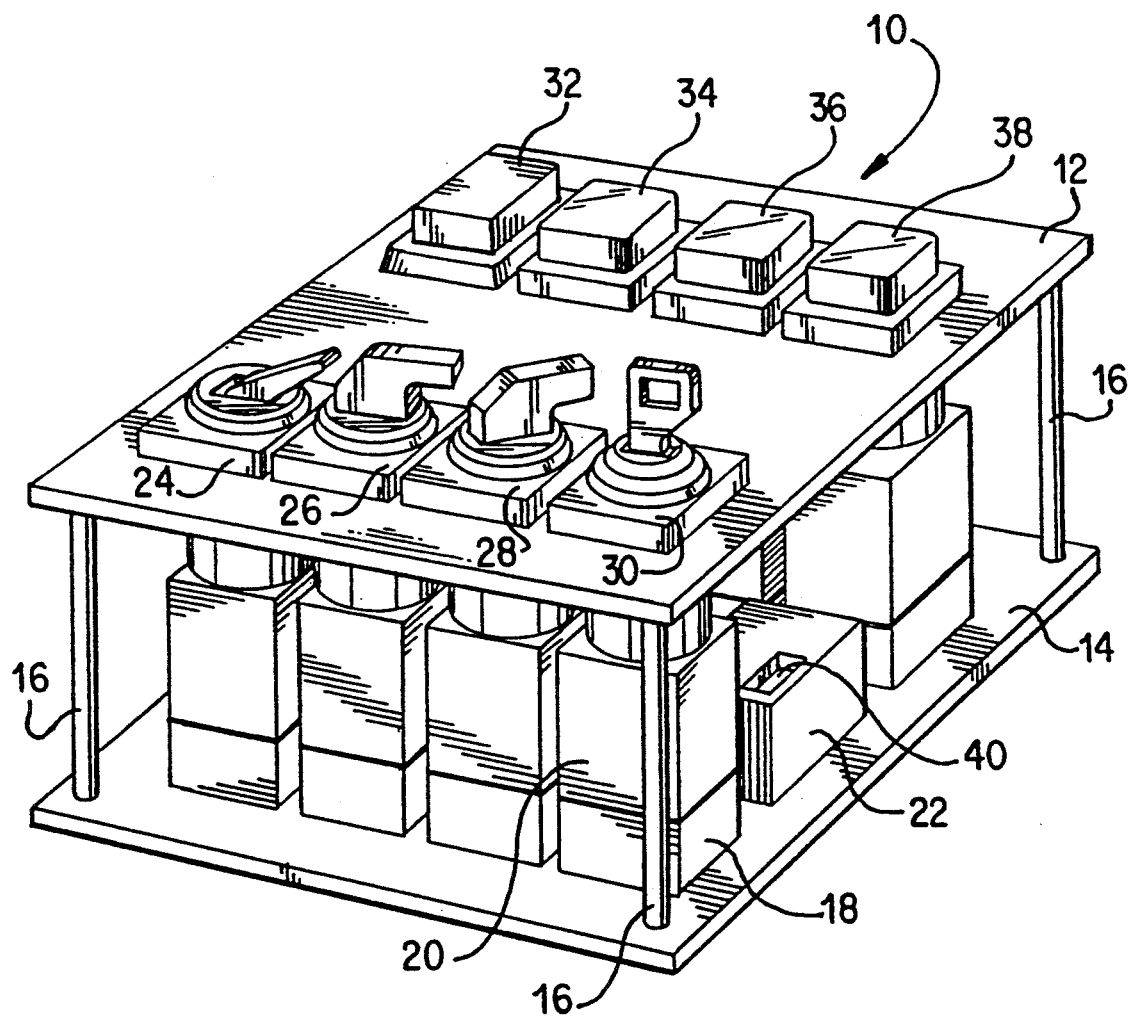
FIG. 1 is a perspective view of the operator interface panel assembly constructed in accordance with the teachings of the present invention.

Referring to FIG. 1 of the drawings, a typical operator interface panel assembly 10 is illustrated. It consists of a front panel 12 attached to a circuit board assembly 14 by four standoffs 16. The circuit board assembly 14 contains eight mounting sockets 18 for receiving up to eight contact module 20. A serial input/output (I/O) scanner module 22 completes the circuit board assembly 14. A variety of operators are attached to the front panel. These include a toggle switch 24, a three position selector switch 26, a two position selector switch 28, a keyswitch 30, and an illuminated push button switch 32. Pilot lights 34, 36, and 38 are also shown.

Figure 2:
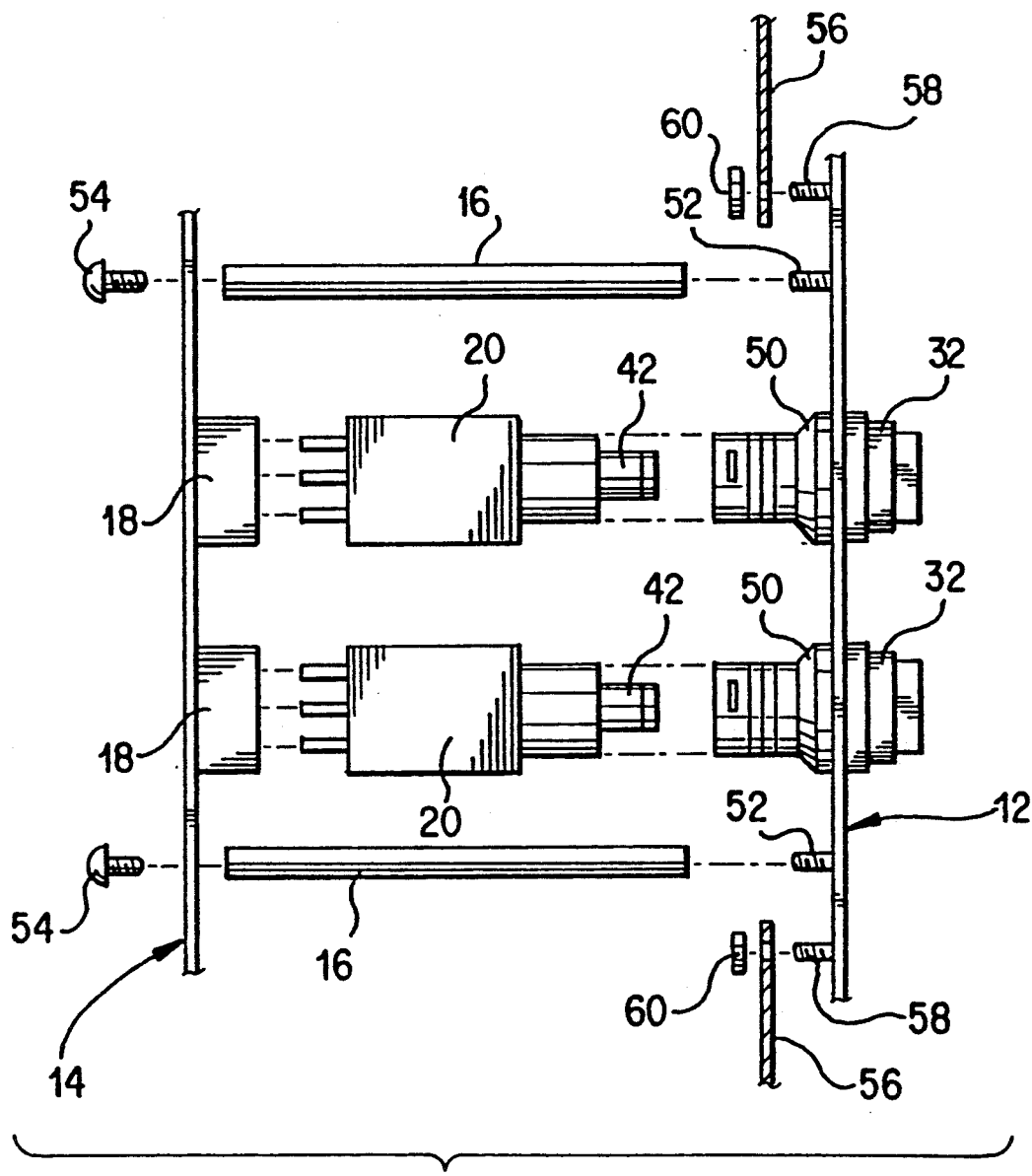
FIG. 2 is a side view of a typical switch location, illustrating the mounting details.

A more detailed description of the assembly 10 is shown by the side view of FIG. 2. Front panel 12 has openings (not shown) through which push button switch operators 32 are mounted and secured by threaded locking collar 50. A notch in the openings prevent the operator 32 from rotating in the opening. Lamp 42 is inserted in contact module 20 which is plugged into mounting socket 18 of circuit board assembly 14. The operator 32 is inserted inside the contact block 20. Threaded standoffs 16 are screwed into threaded studs 52 that are welded to front panel 12. Standoff 16 is dimensioned such that the total length of it is equal to the combined length of the portion of the operator 32 that extends through the front panel 12, and the contact block 20, and the mounting socket 18. Threaded fasteners 54 secure the circuit board assembly 14 to the standoffs 16. Completing this step results in all components being secured to the front panel 12 to complete the operator interface panel assembly 10. Once this is completed, the operator interface panel assembly 10 can be attached to an enclosure 56 by another set of four threaded studs 58 which are also welded to front panel 12 and a threaded fastener 60.

Figure 3:
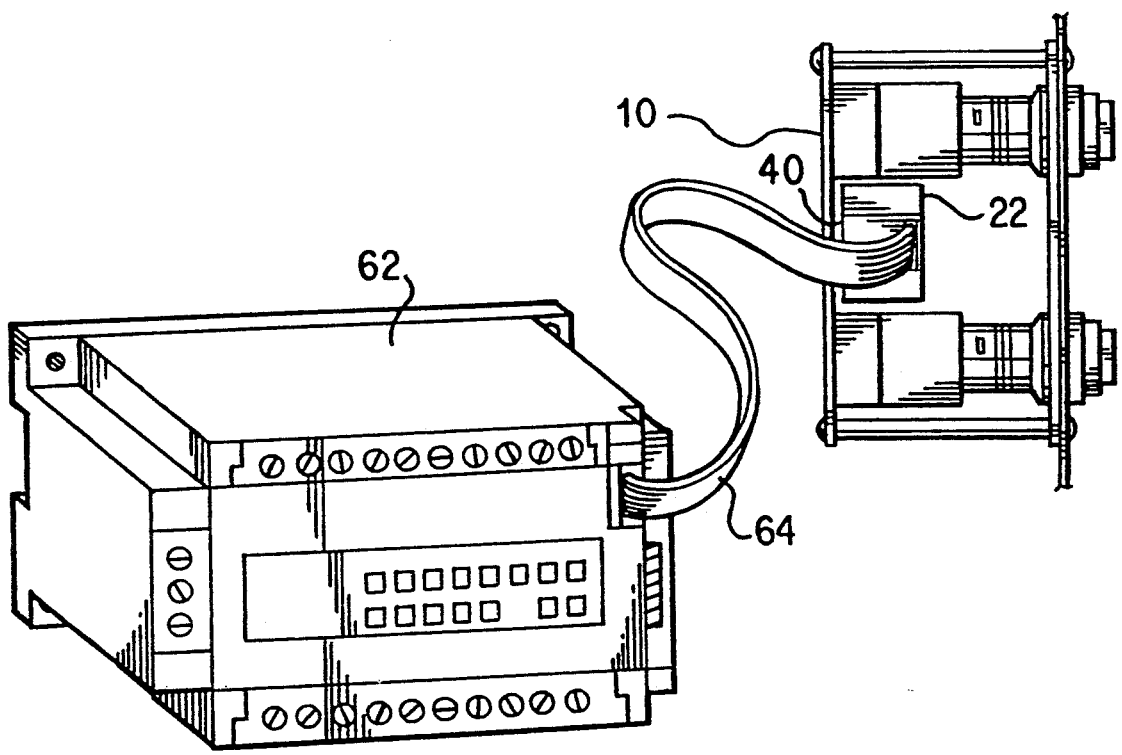
FIG. 3 is an electrical schematic of the operator interface panel assembly connected to a programmable logic controller.

Wiring the operator interface panel assembly 10 to a programmable logic controller 62 is accomplished with a multi-conductor cable 64 that is plugged into socket 40 of serial I/O scanner module 22 as depicted in FIG. 3.

Figure 4:
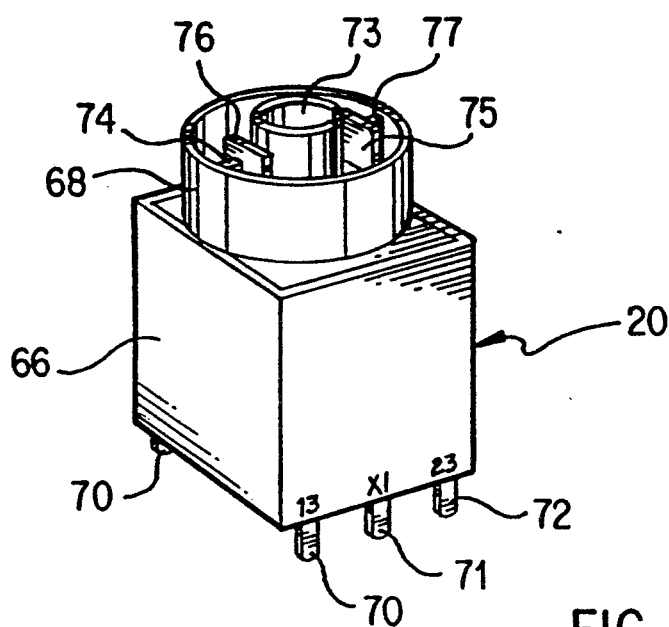
FIG. 4 shows a typical contact block.

Details of a contact module 20 are shown in FIG. 4. The lower portion 66 of contact module 20 is rectangular and the upper portion 68 is cylindrically shaped. The lower portion 66 houses the contacts and terminations 70, 71 and 72 that plug into the mounting socket 18. The details of the contacts are not an object of applicants' invention and will not be described. The upper portion 68 contains a lamp holder 73, a left moveable tab 74 and a right moveable tab 75. Depressing left tab 74 will result in activating the contact connected to terminals 70 and referenced by the table in FIG. 4A by the numbers 13-14. This could be a normally open or a normally closed contact or no contact at all. Depressing right tab 75 will result in activating the contact connected to terminals 72 and referenced by the table in FIG. 4A by the numbers 23-24. This could be a normally open or a normally closed contact or no contact at all. Lampholder 73 is connected to terminals 71 and referenced by the table in FIG. 4A by the values X1-X2. Tabs 76 and 77 serve as locator tabs for the various operators 30, 32, etc. The various combinations that are possible with this contact module are summarized by the table in FIG. 4A by the letters A, B, C, D, E, and F.

Figures 4A, 5:
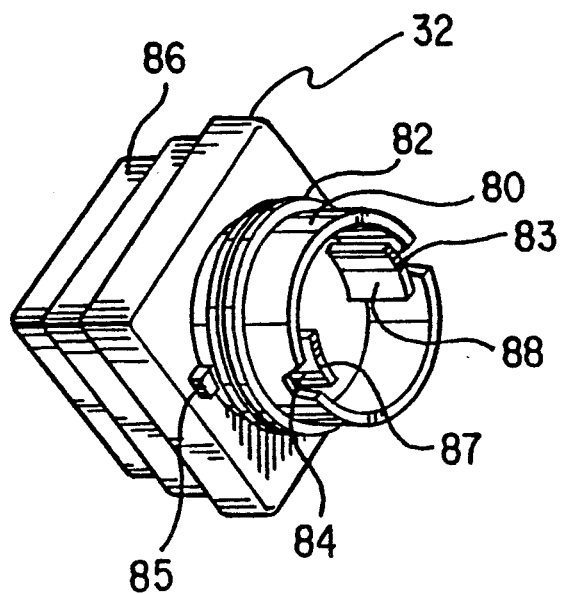
FIG. 4A shows the various options and configurations available for the contact block.
FIG. 5 shows a typical operator option for an illuminated push button.

A typical operator 32 is shown in FIG. 5. The tubular end consists of a front portion 80 and a threaded portion 82. The front portion 80 is of smaller outside diameter of the inside diameter of the upper portion of the contact module 20. This permits the operator 32 to be combined with the contact module 20. Notches 83 and 84 of front portion 80 align with locator tabs 76 and 77 of contact module to insure correct orientation of the operator 32 with the contact module 20. The threaded portion 82 accepts a threaded locking collar 50 which secures the operator 32 to the front panel 12. A tab 85 is provided to prevent rotation of the operator 32 by mating with a notch in the opening of the front panel 12. A spring loaded translucent lens 86 serves to provide the means for actuating the contact module 20 and serves as a lens for lamp 42 (if used). Fingers 87 and 88 align with left tab 76 and right tab 77 of contact module 20. Depressing lens 86 causes the fingers 87 and 88 to extend outward which in turn causes left tab 76 and right tab 77 to also be depressed, thus activating their associated contacts. Although only the push button operator has been described, the other types disclosed in FIG. 1 operate in similar manner. Operating the switch causes the fingers 87 and 88 to extend and depress the tabs 76 and 77 of the contact module 20, with the resultant operation of the contacts associated with it.

Figure 6:
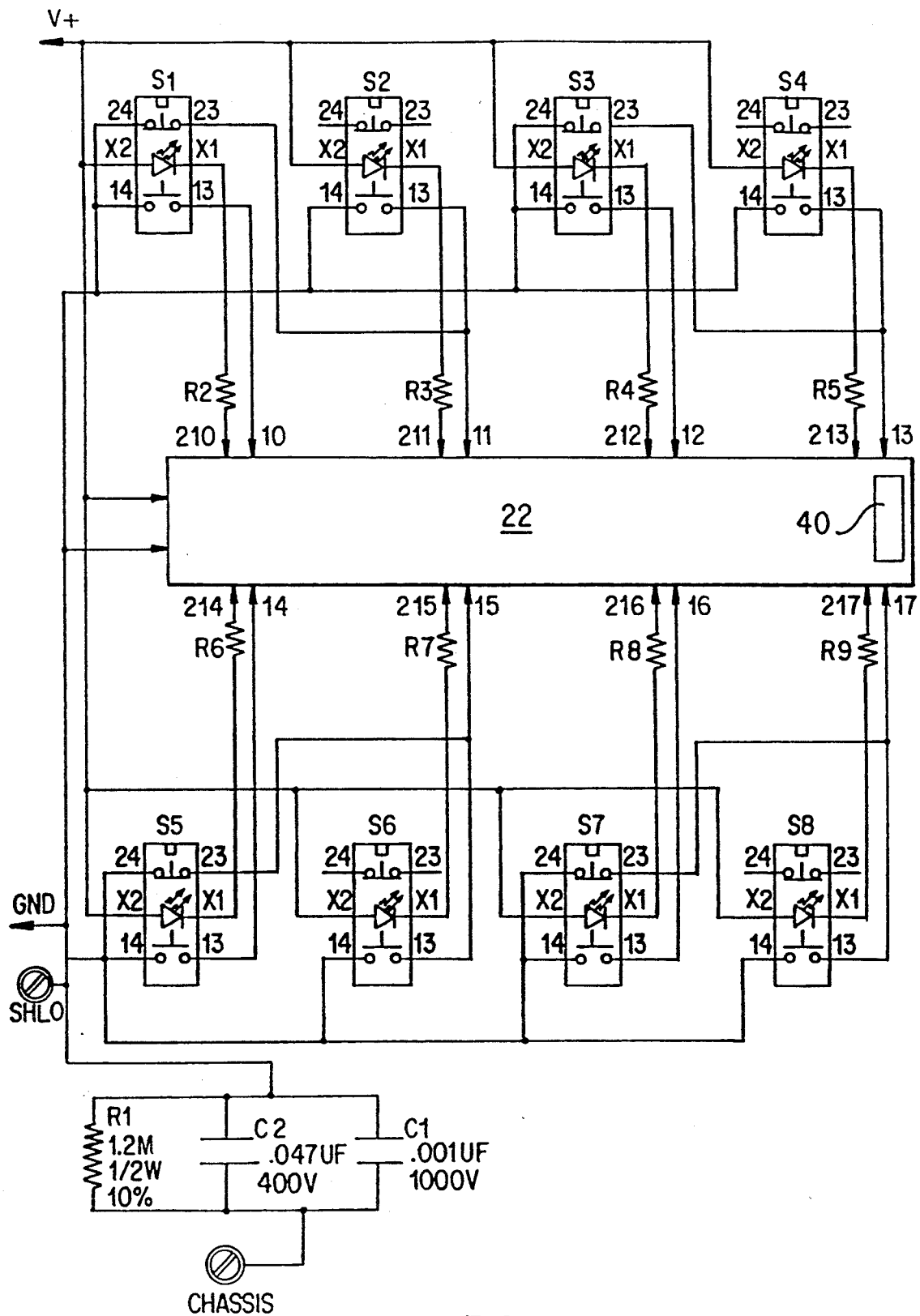
FIG. 6 is an electrical schematic of the printed circuit board.

FIG. 6 is an electrical schematic of the preferred embodiment. Eight switch locations S1 through S8 are shown. Serial I/O scanner module 22 accepts inputs from pin 13 of locations S1, S3, S5, and S7, identified as address 10, 12, 14, and 16, respectively. Address 11 accepts an input from either pin 23 of S1 or pin 13 of S2. This permits a two pole contact module 20 to be used in one location. However, this requires that the adjacent switch location be vacant or only to be used as a pilot light. Addresses 13, 15, and 17 operate in a similar fashion as Address !1. Pilot lamps 42 are activated as outputs of scanner module 20 at Addresses 210 through 217. Resisters R2-R9 provide current limiting for the light emitting diodes, if used, connected across terminals X1-X2. Socket 40 provides the means for a serial connection between the operator interface panel and the PLC. Power for the module is supplied by the PLC through the cable connection. Resister R1 and Capacitors C1 and C2 combine to provide noise filtering. The scanner module 20 decodes the information from and to the PLC to select the correct switch or pilot light address and status.

While the specific embodiments have been illustrated and described, numerous modifications are possible without departing from the scope or spirit of the invention.

We claim:

1. An electrical assembly with a programmable logic controller having a plurality of outwardly extending operator interface components of a predetermined same length functioning as input and output devices therein, the assembly comprising:
    a front panel means having a plurality of openings for receiving a functional part of said components, said components consisting of an operator and a contact module in which said operator extends through the openings in said front panel means;
    a circuit board means having a plurality of mounting sockets for receiving a terminal of said components, said circuit board means further having a scanner module for interfacing said assembly to said programmable logic controller;
    a plurality of standoffs, said standoffs having a predetermined same length, said length for providing the spacing between said front panel means and said circuit board means to accommodate said predetermined same length for said components, said standoffs further providing the means for attaching said circuit board means to said front panel means and further providing the means to secure said components in said assembly; and
    wherein said components are interchangeable within said assembly without changing said circuit board and said mounting sockets.

2. The assembly as in claim 1 wherein said components are reconfigurable without wiring modifications.

3. The assembly as in claim 1 wherein said contact module is a pilot lamp.

4. The assembly as in claim 1 wherein said operator is a switch.

5. The assembly as in claim 4 wherein said contact module is a one pole device having a normally open contact.

6. The assembly as in claim 4 wherein said contact module is a two pole device having normally open contacts.

7. The assembly as in claim 4 wherein said contact module is a two pole device having normally closed contacts.

8. The assembly as in claim 4 wherein said contact module is a one pole device having a normally closed contact.

9. The assembly as in claim 4 wherein said contact module is a two pole device having a normally open contact and a normally closed contact.

10. The assembly as in claim 4 wherein said contact module further contains a pilot lamp.

* * * * *